(12) United States Patent
Shih et al.

(10) Patent No.: US 10,147,608 B1
(45) Date of Patent: Dec. 4, 2018

(54) METHOD FOR PREPARING A PATTERNED TARGET LAYER

(71) Applicant: NANYA TECHNOLOGY CORPORATION, New Taipei (TW)

(72) Inventors: Shing-Yih Shih, New Taipei (TW); Chih-Wei Cheng, New Taipei (TW); Ming-Tsung Ko, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/808,414

(22) Filed: Nov. 9, 2017

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
USPC ........................................................ 438/695
See application file for complete search history.

(56) References Cited

U.S. PATENT DOCUMENTS

2009/0142932 A1* 6/2009 Jung .................. H01L 21/3086
438/736

* cited by examiner

*Primary Examiner* — Roberts P Culbert
(74) *Attorney, Agent, or Firm* — Muncy, Geissler, Olds & Lowe, P.C.

(57) ABSTRACT

A method for preparing a patterned target layer is provided. A target layer is formed over a substrate. A multi-layered hard mask layer is formed over the target layer. The multi-layered hard mask layer includes a first hard mask layer over the target layer, a second hard mask layer between the target layer and the first hard mask layer, and a third hard mask layer between the target layer and the second hard mask layer, wherein a material of the second hard mask layer is different from a material of the first hard mask layer and a material of the third hard mask layer. The multi-layered hard mask layer is used as a hard mask layer to prepare a fine pattern on the target layer.

13 Claims, 13 Drawing Sheets

METHOD FOR PREPARING A PATTERNED TARGET LAYER

TECHNICAL FIELD

The present disclosure relates to method for preparing a patterned target layer, and more particularly, to a method for preparing fine patterns in a target layer.

DISCUSSION OF THE BACKGROUND

In semiconductor manufacturing processes, photolithography and etching techniques are commonly adopted to define patterns of a target layer. Generally, an integrated circuit layout is designed and outputted onto one or more photomasks. The integrated circuit layout is then transferred from the photomask(s) to a hard mask layer to form a mask pattern, and is subsequently transferred to a target layer from the mask pattern. However, with the advancing miniaturization and integration requirements of electronic or semiconductor devices, including memory devices such as dynamic random access memories (DRAMs), flash memories, static random access memories (SRAMs), and ferroelectric (FE) memories, the sizes such as line width and gap of patterns for such devices become finer and more miniaturized as well. Accordingly, the continual reduction in pattern size places ever-greater demands on the techniques used to prepare the patterned target layer.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing a patterned target layer. The method includes the following steps. A target layer is formed over a substrate. A multi-layered hard mask layer is formed over the target layer. The multi-layered hard mask layer includes a first hard mask layer over the target layer, a second hard mask layer between the target layer and the first hard mask layer, and a third hard mask layer between the target layer and the second hard mask layer, wherein a material of the second hard mask layer is different from a material of the first hard mask layer and a material of the third hard mask layer. The first hard mask layer is patterned to form a plurality of first hard mask patterns. The second hard mask layer is patterned to form a plurality of second hard mask patterns, wherein a portion of the second hard mask patterns is covered with the first hard mask patterns, and another portion of the second hard mask patterns is exposed through the first hard mask patterns. The third hard mask layer, exposed through the first hard mask patterns and the second hard mask patterns, is removed to form a plurality of third hard mask patterns. The target layer exposed through the third hard mask patterns is removed.

In some embodiments, the method further includes removing the multi-layered hard mask layer from the target layer subsequent to the patterning the target layer.

In some embodiments, the patterning the first hard mask layer to form the plurality of first hard mask patterns includes forming a first sacrificial layer over the multi-layered hard mask layer; forming a plurality of first photoresist patterns over the first sacrificial layer; etching the first sacrificial layer and the first hard mask layer exposed through the first photoresist patterns to form the plurality of first hard mask patterns; and removing the first photoresist patterns and the first sacrificial layer from the multi-layered hard mask layer.

In some embodiments, the patterning the second hard mask layer to form the plurality of second hard mask patterns includes forming a second sacrificial layer over the multi-layered hard mask layer; forming a plurality of second photoresist patterns over the second sacrificial layer, wherein the second photoresist patterns are arranged offset from the first hard mask patterns; etching the second sacrificial layer and the second hard mask layer exposed through the second photoresist patterns and exposed through the plurality of first hard mask patterns to form the plurality of second hard mask patterns; and removing the second photoresist patterns and the second sacrificial layer from the multi-layered hard mask layer.

In some embodiments, the material of the first hard mask layer is the same as the material of the third hard mask layer.

In some embodiments, a thickness of the first hard mask layer is substantially equal to or less than a thickness of the third hard mask layer.

In some embodiments, the first hard mask patterns over the second hard mask patterns and the third hard mask layer exposed through the second hard mask patterns are removed simultaneously.

In some embodiments, the removing the target layer exposed through the third hard mask patterns includes etching the target layer exposed through the third hard mask patterns.

In some embodiments, the removing the target layer exposed through the third hard mask patterns includes partially removing the target layer exposed through the third hard mask patterns.

In some embodiments, the removing the target layer exposed through the third hard mask patterns includes entirely removing the target layer exposed through the third hard mask patterns.

In some embodiments, the method further includes forming a lower hard mask layer over the target layer prior to the forming the multi-layered hard mask layer.

In some embodiments, the method further includes removing the lower hard mask layer exposed through the third hard mask patterns prior to the removing the target layer exposed through the third hard mask patterns.

In some embodiments, a material of the lower hard mask layer is different from the material of the third hard mask layer.

One aspect of the present disclosure provides a method for preparing a patterned target layer. The method includes the following steps. A target layer is formed over a substrate. A hard mask layer is formed over the target layer. A plurality of first patterns and second patterns are formed over the hard mask layer, wherein the first patterns are thinner than the second patterns. The hard mask layer exposed through the first patterns and the second patterns is etched to form a plurality of hard mask patterns. The target layer exposed through the hard mask patterns is etched.

In some embodiments of the present disclosure, the multi-layered hard mask layer is configured as an upper hard mask layer to prepare fine patterns in the target layer. In some embodiments, the first hard mask patterns and the second hard mask patterns are formed by two photolithography processes, and thus the pattern density of the multi-layered hard mask layer can be increased without being limited by photolithography process limitations. In addition, the multi-layered hard mask layer is formed from three or more hard mask layers, and at least some of the hard mask layers have different etching characteristics. Accordingly, the shapes of the hard mask patterns of the multi-layered hard mask layer can be maintained, and thus the hard mask patterns can be precisely transferred to the target layer.

In contrast, if a single-layered hard mask layer is adopted to prepare a patterned target layer, the single-layered hard mask layer must undergo several etching processes, and thus the hard mask patterns are damaged. The damaged hard mask patterns result in poor pattern transfer to the target layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "target layer" refers to a layer in which a pattern is to be formed. A target layer may be part of a substrate. A target layer may be a metal layer, a semiconductor layer, and/or an insulating layer formed over the substrate.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etching or other removal process. The mask can be a photoresist, or a hard mask. In some embodiments, a patterning process is adopted to form a patterned layer directly on a surface. The patterning process includes forming a photosensitive film on the surface, conducting a photolithography process including an exposure process and a developing process, and performing an etching process.

Figure 1:
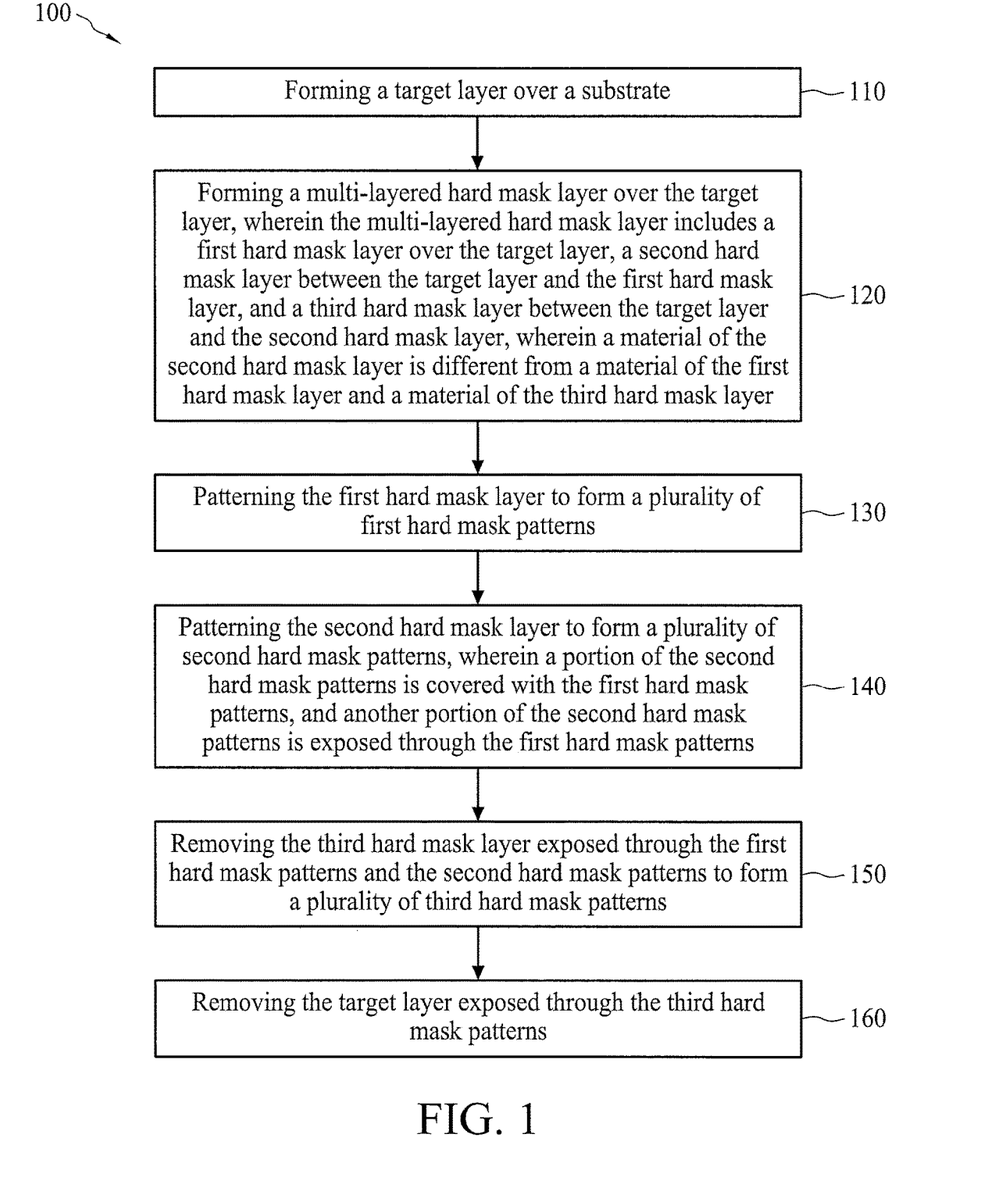
FIG. 1 is a flow diagram illustrating a method for preparing a patterned target layer in accordance with some embodiments of the present disclosure.

FIG. 1 is a flow diagram illustrating a method for preparing a patterned target layer, in accordance with some embodiments of the present disclosure. As shown in FIG. 1, the method 100 for preparing a patterned target layer begins with a step 110 in which a target layer is formed over a substrate. The method 100 for preparing a patterned target layer proceeds with a step 120 in which a multi-layered hard mask layer is formed over the target layer. In some embodiments, the multi-layered hard mask layer includes a first hard mask layer over the target layer, a second hard mask layer between the target layer and the first hard mask layer, a third hard mask layer between the target layer and the second hard mask layer. The material of the second hard mask layer is different from the material of the first hard mask layer and the material of the third hard mask layer. The method 100 for preparing a patterned target layer continues with a step 130 in which the first hard mask layer is patterned to form a plurality of first hard mask patterns. The method 100 for preparing a patterned target layer proceeds with a step 140 in which the second hard mask layer is patterned to form a plurality of second hard mask patterns. In some embodiments, a portion of the second hard mask patterns is covered with the first hard mask patterns, and another portion of the second hard mask patterns is exposed through the first hard mask patterns. The method 100 for preparing a patterned target layer continues with a step 150 in which the third hard mask layer exposed through the second hard mask patterns is removed to form a plurality of third hard mask patterns. The method 100 for preparing a patterned target layer proceeds with a step 160 in which the target layer exposed through the third hard mask patterns is removed.

The method 100 is merely an example, and is not intended to limit the present disclosure beyond what is explicitly recited in the claims. Additional steps can be provided before, during, and after the method 100, and some operations described can be replaced, eliminated, or moved around for additional embodiments of the method.

Figure 2:
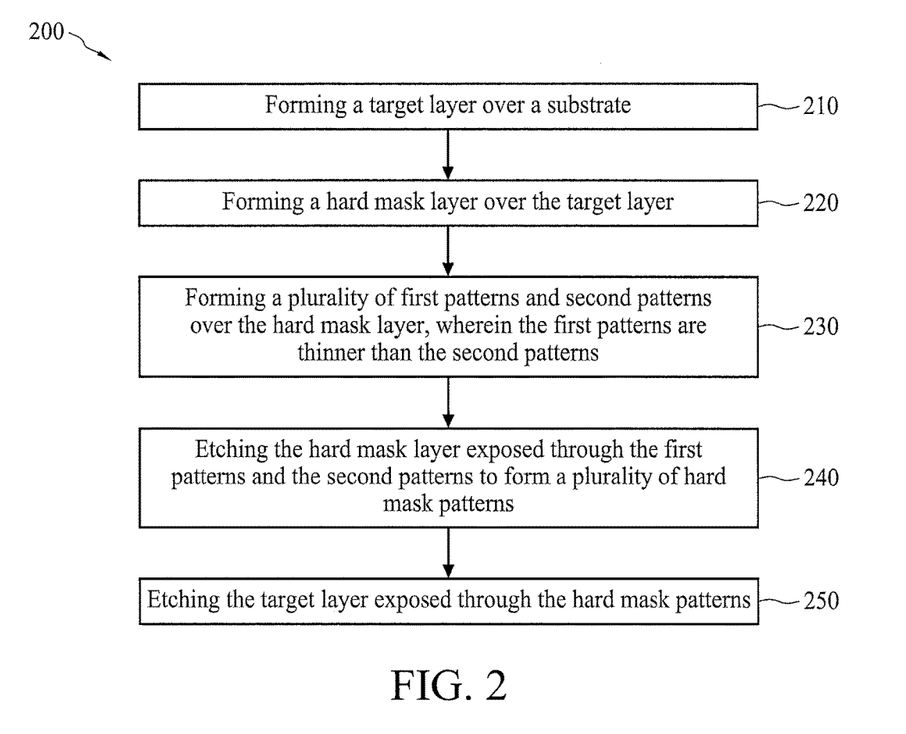
FIG. 2 is a flow diagram illustrating a method for preparing a patterned target layer in accordance with some embodiments of the present disclosure.

FIG. 2 is a flow diagram illustrating a method for preparing a patterned target layer, in accordance with some embodiments of the present disclosure. As shown in FIG. 2, the method 200 for preparing a patterned target layer begins with a step 210 in which a target layer is formed over a substrate. The method 200 for preparing a patterned target layer proceeds with a step 220 in which a hard mask layer is formed over the target layer. The method 200 for preparing a patterned target layer continues with a step 230 in which a plurality of first patterns and second patterns are formed over the hard mask layer. The first patterns are thinner than the second patterns. The method 200 for preparing a patterned target layer proceeds with a step 240 in which the hard mask layer exposed through the first patterns and the second patterns is etched to form a plurality of hard mask patterns. The method 200 for preparing a patterned target layer continues with a step 250 in which the target layer exposed through the hard mask patterns is etched.

The method 200 is merely an example, and is not intended to limit the present disclosure beyond what is explicitly recited in the claims. Additional steps can be provided before, during, and after the method 200, and some operations described can be replaced, eliminated, or moved around for additional embodiments of the method.

Figure 3A:
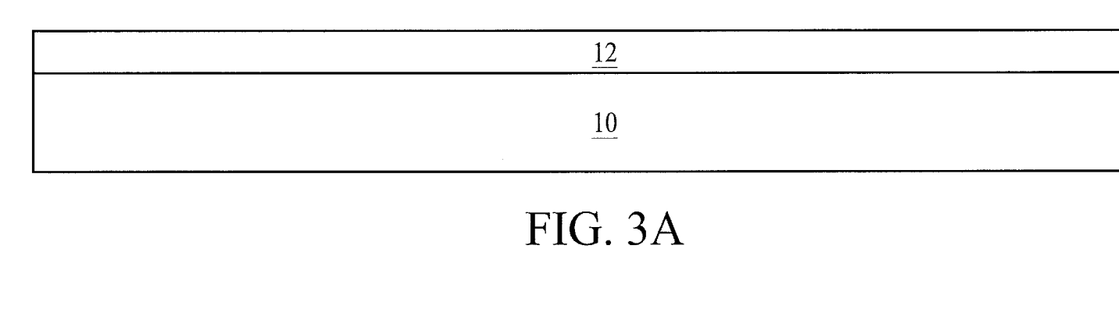
FIG. 3A, FIG. 3B, FIG. 3C, FIG. 3D, FIG. 3E, FIG. 3F, FIG. 3G, FIG. 3H and FIG. 3I are schematic diagrams at one or more of various steps of preparing a patterned target layer in accordance with some embodiments of the present disclosure.

FIG. 3A, FIG. 3B, FIG. 3C, FIG. 3D, FIG. 3E, FIG. 3F, FIG. 3G, FIG. 3H and FIG. 3I are schematic diagrams at one or more of various steps of preparing a patterned target layer, in accordance with some embodiments of the present disclosure. As shown in FIG. 3A, a substrate 10 is provided. The substrate 10 may include a semiconductor substrate. By way of examples, the material of the substrate 10 may include elementary semiconductor such as silicon or germanium; compound semiconductor such as silicon germanium, silicon carbide, gallium arsenic, gallium phosphide, indium phosphide or indium arsenide; combinations thereof; or other suitable material. A target layer 12 is formed over the substrate 10. The target layer 12 may include a single-layered target layer or a multi-layered target layer. In some embodiments, the target layer 12 may be a layer in which various IC components, parts, or structures are to be formed through IC fabrication processes. Examples of the components, parts, and structures may include transistors, capacitors, resistors, diodes, conductive lines, electrodes, spacers, trenches, etc. The target layer 12 can include materials that are selected based on the types of devices to be formed. Examples of the material for the target layer 12 include, for example, but are not limited to, dielectric materials, semiconductive materials, and conductive materials.

Figure 3B:
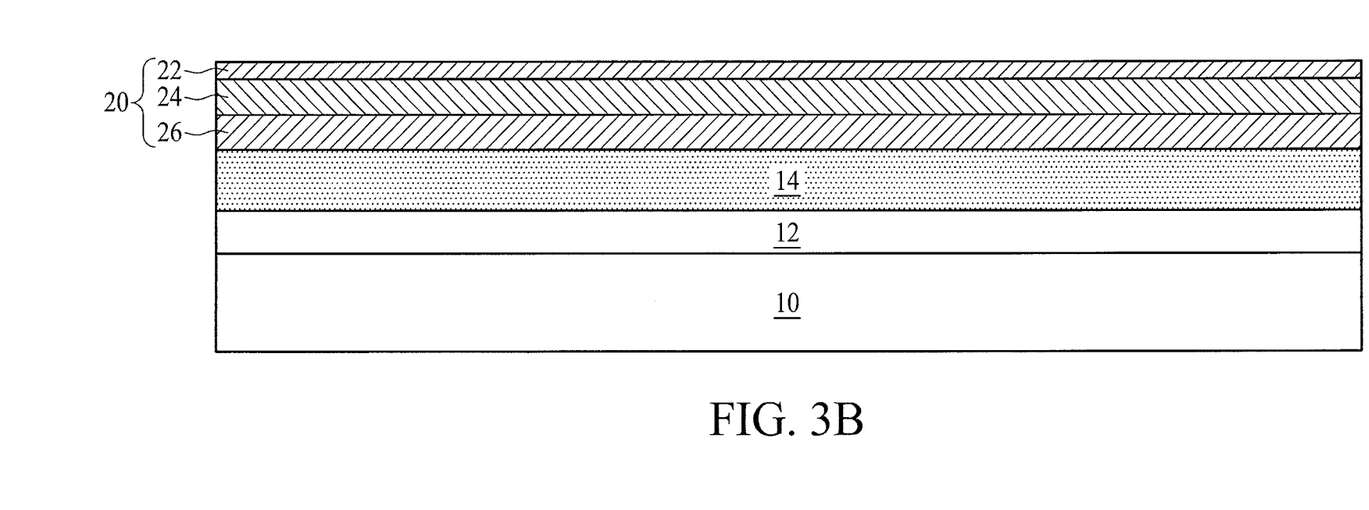

As shown in FIG. 3B, a lower hard mask layer 14 may be optionally formed over the target layer 12. In some embodiments, the lower hard mask layer 14 and the target layer 12 may include different materials or materials sufficiently different in compositions such that the target layer 12 can be selectively removable using an appropriate etch chemistry relative to the lower hard mask layer 14.

In some embodiments, a multi-layered hard mask layer 20 is formed over the target layer 12. For example, the multi-layered hard mask layer 20 may be formed on the lower hard mask layer 14 if the lower hard mask layer 14 exists. The multi-layered hard mask layer 20 may be configured as an upper hard mask layer. In some embodiments, the multi-layered hard mask layer 20 includes a first hard mask layer 22, a second hard mask layer 24 and a third hard mask layer 26. The first hard mask layer 22 is disposed over the target layer 12. The second hard mask layer 24 is disposed between the target layer 12 and the first hard mask layer 22. The third hard mask layer 26 is disposed between the target layer 12 and the second hard mask layer 24. In some embodiments, each hard mask layer of the multi-layered hard mask layer 20 and the target layer 12 may include different materials or materials sufficiently different in compositions such that the target layer 12 can be selectively removable using an appropriate etch chemistry relative to the multi-layered hard mask layer 20. In some embodiments, any two adjacent hard mask layers of the multi-layered hard mask layer 20 and the lower hard mask layer 14 may include different materials or materials sufficiently different in compositions such that two adjacent hard mask layers of the multi-layered hard mask layer 20 and the lower hard mask layer 14 can be selectively removable using an appropriate etch chemistry with respect to one another.

In some embodiments, the material of the second hard mask layer 24 is different from the material of the first hard mask layer 22 and the material of the third hard mask layer 26. In some embodiments, the material of the first hard mask layer 22 may be the same as the material of the third hard mask layer 26. Examples of the material for the hard mask layers may individually include oxide compound such as silicon oxide, nitride compound such as silicon nitride, oxynitride compound such as silicon oxynitride, semiconductive material such as silicon, conductive material such as metal, or other suitable materials. By way of examples, the material of the first hard mask layer 22 and the third hard mask layer 26 may include silicon-rich silicon oxynitride, and the material of the second hard mask layer 24 may include oxygen-rich silicon oxynitride.

Figure 3C:
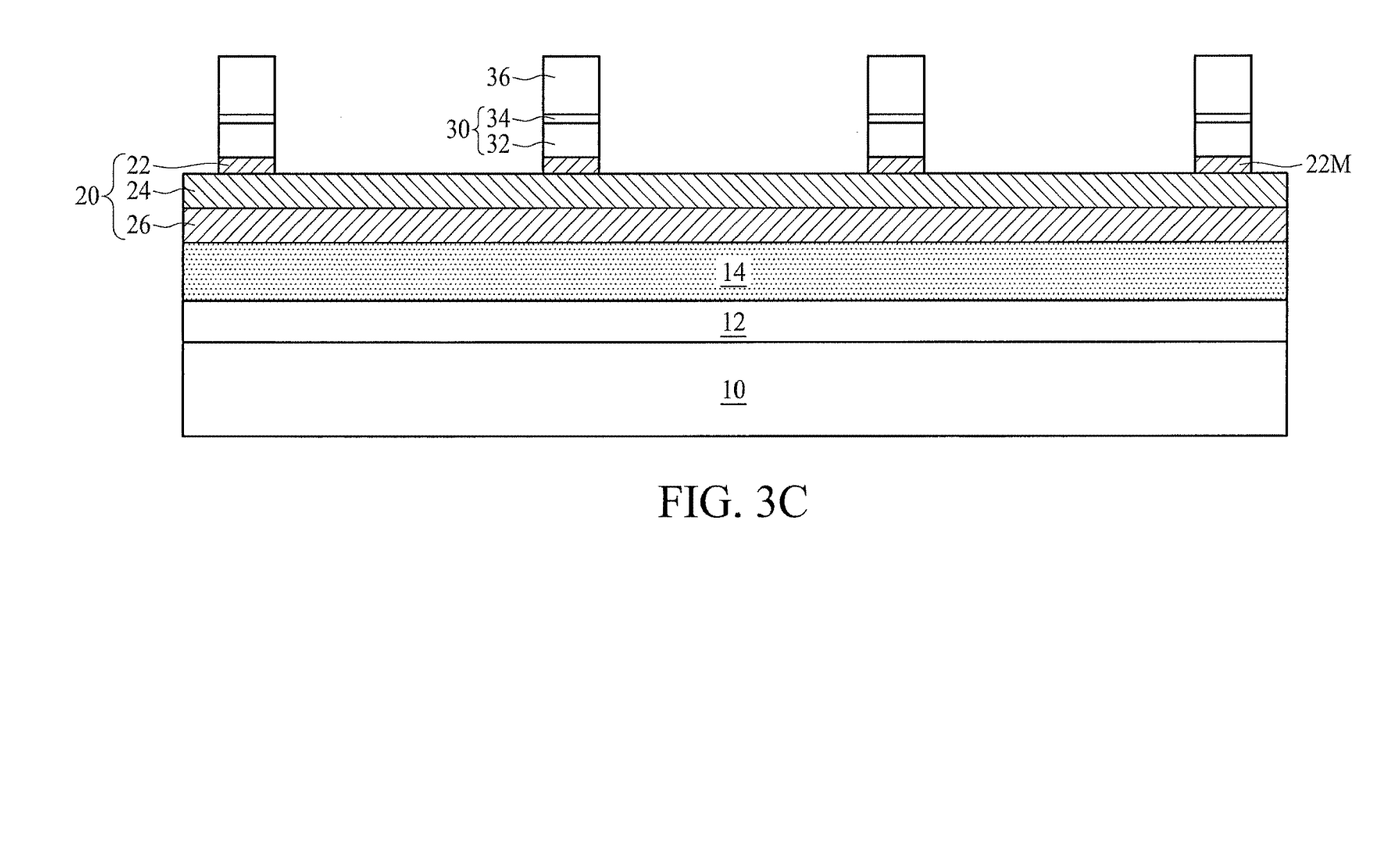

As shown in FIG. 3C, the first hard mask layer 22 is patterned to form a plurality of first hard mask patterns 22M. In some embodiments, the first hard mask layer 22 is patterned by photolithography and etching techniques, but the disclosure is not limited thereto. In some exemplary embodiments, a first sacrificial layer 30 is formed over the multi-layered hard mask layer 20. The first sacrificial layer 30 may be configured as a resist layer or a hard mask layer to etch the first hard mask layer 22. For example, the first sacrificial layer 30 may include a first layer 32 and a second layer 34 stacked on the first layer 32. In some embodiments, one of the first layer 32 and the second layer 34 may include an anti-reflective coating (ARC). A plurality of first photoresist patterns 36 are formed over the first sacrificial layer 30 by, for example, a first photolithography process using a photomask (not shown). The first sacrificial layer 30 exposed through the first photoresist patterns 36 is etched, and the first hard mask layer 22 is then etched to form the first hard mask patterns 22M. In some embodiments, the first hard mask layer 22 may be etched by an anisotropic etching such as a plasma etching or the like, such that the pattern transfer can be executed more precisely.

Figure 3D:
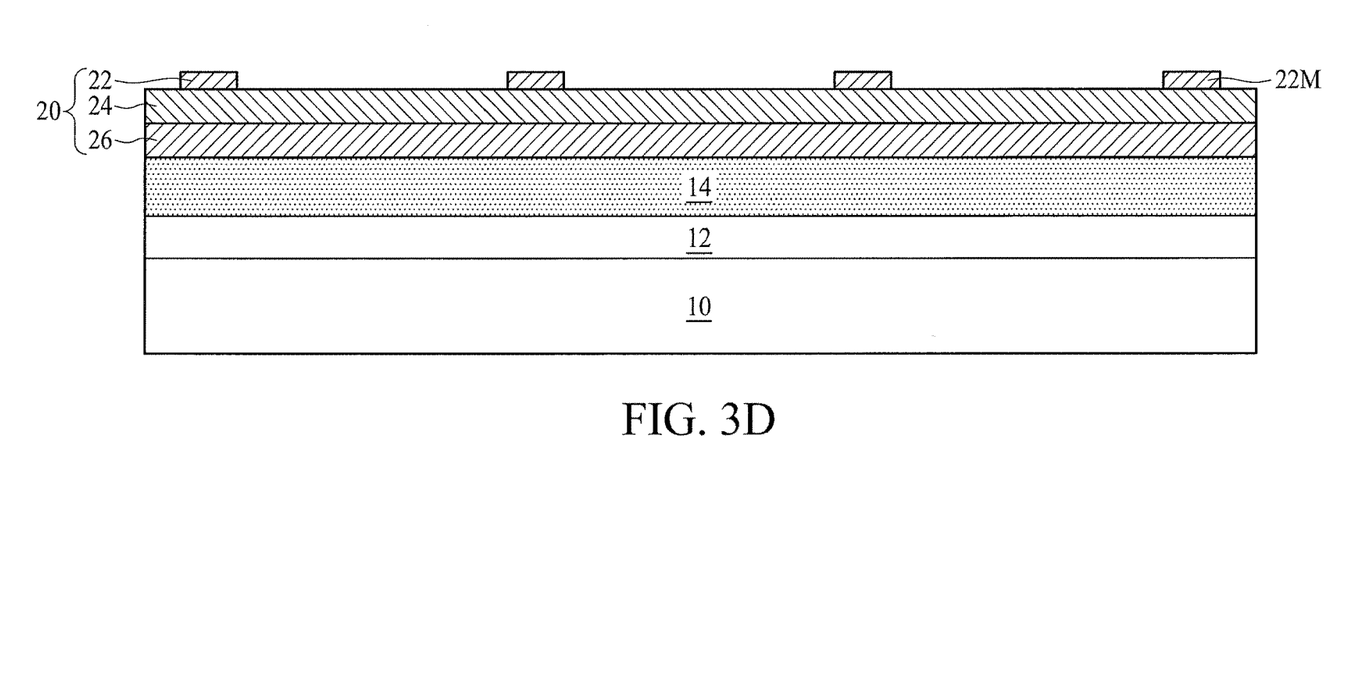

As shown in FIG. 3D, the first photoresist patterns 36 and the first sacrificial layer 30 are removed from the first hard mask patterns 22M. In some embodiments, the first photoresist patterns 36 may be removed after the first sacrificial layer 30 is etched, and the first hard mask layer 22 is then etched using the first sacrificial layer 30 as a hard mask. In some alternative embodiments, the first photoresist patterns 36 may be removed after the first sacrificial layer 30 and the first hard mask layer 22 are etched.

Figure 3E:
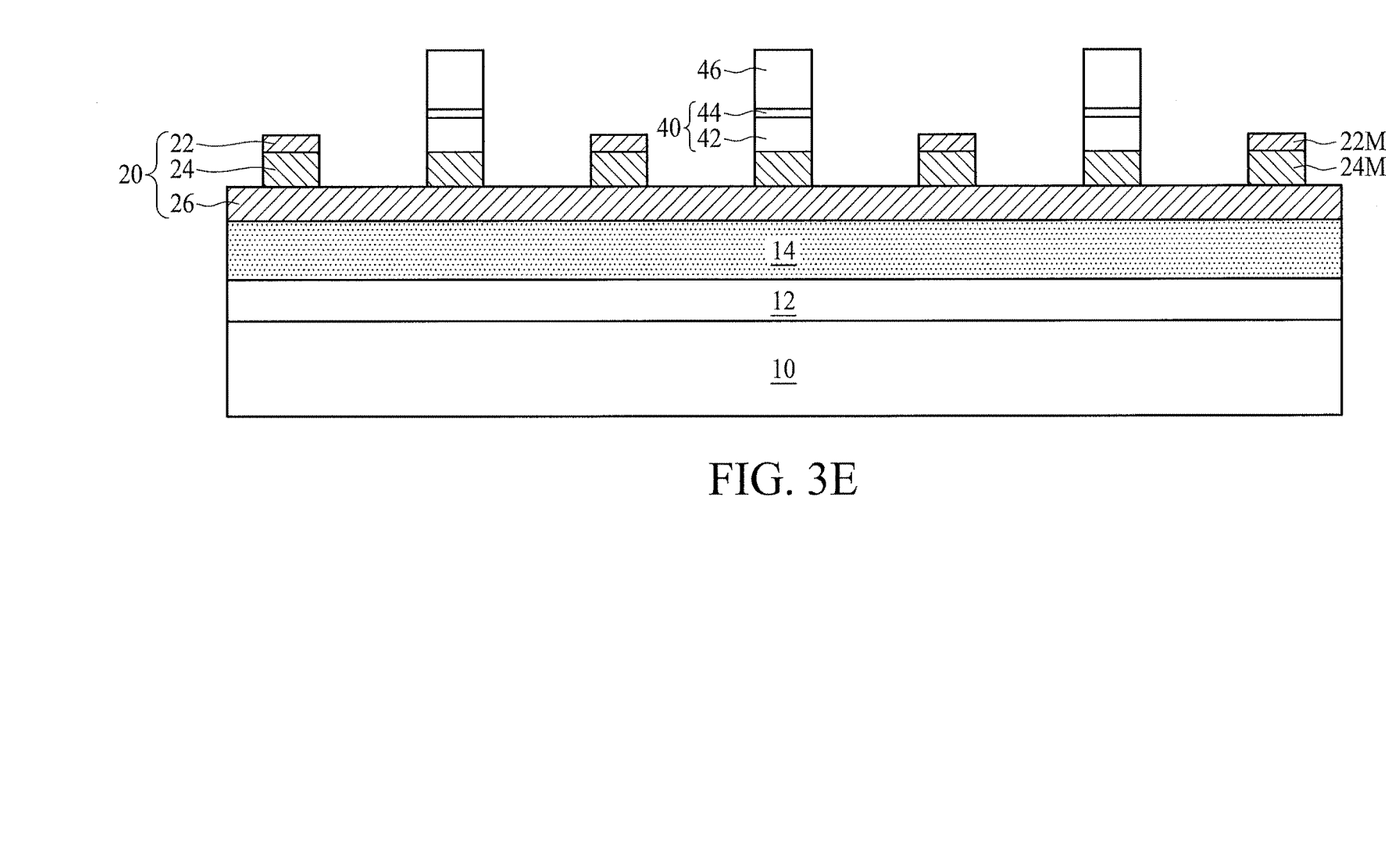

As shown in FIG. 3E, the second hard mask layer 24 is patterned to form a plurality of second hard mask patterns 24M. In some embodiments, a portion of the second hard mask patterns 24M is covered with the first hard mask patterns 22M, and another portion of the second hard mask patterns 24M is exposed through the first hard mask patterns 22M. In some embodiments, the second hard mask patterns 24M exposed through the first hard mask patterns 22M may be referred to as first patterns, while the second hard mask patterns 24M and the first hard mask patterns 22M covered thereon may be referred to as second patterns. The first patterns are thinner than the second patters.

In some embodiments, the second hard mask layer 24 is patterned by photolithography and etching techniques, but the disclosure is not limited thereto. In some exemplary embodiments, a second sacrificial layer 40 is formed over the multi-layered hard mask layer 20. The second sacrificial layer 40 may be configured as a resist layer or a hard mask layer to etch the second hard mask layer 24. For example, the second sacrificial layer 40 may include a first layer 42 and a second layer 44 stacked on the first layer 42. In some embodiments, one of the first layer 42 and the second layer 44 may include an anti-reflective coating (ARC). A plurality of second photoresist patterns 46 are formed over the second sacrificial layer 40 by, for example, a second photolithography process using a photomask (not shown). The second photoresist patterns 46 are arranged offset from the first hard mask patterns 22M. The second sacrificial layer 40 exposed through the second photoresist patterns 46 is then etched. The second hard mask layer 24 exposed through the second sacrificial layer 40 and exposed through the first hard mask patterns 22M is etched to form the second hard mask patterns 24M. In some embodiments, the second hard mask layer 24 may be etched by an anisotropic etching such as a plasma etching or the like, such that the pattern transfer can be executed more precisely.

Figure 3F:
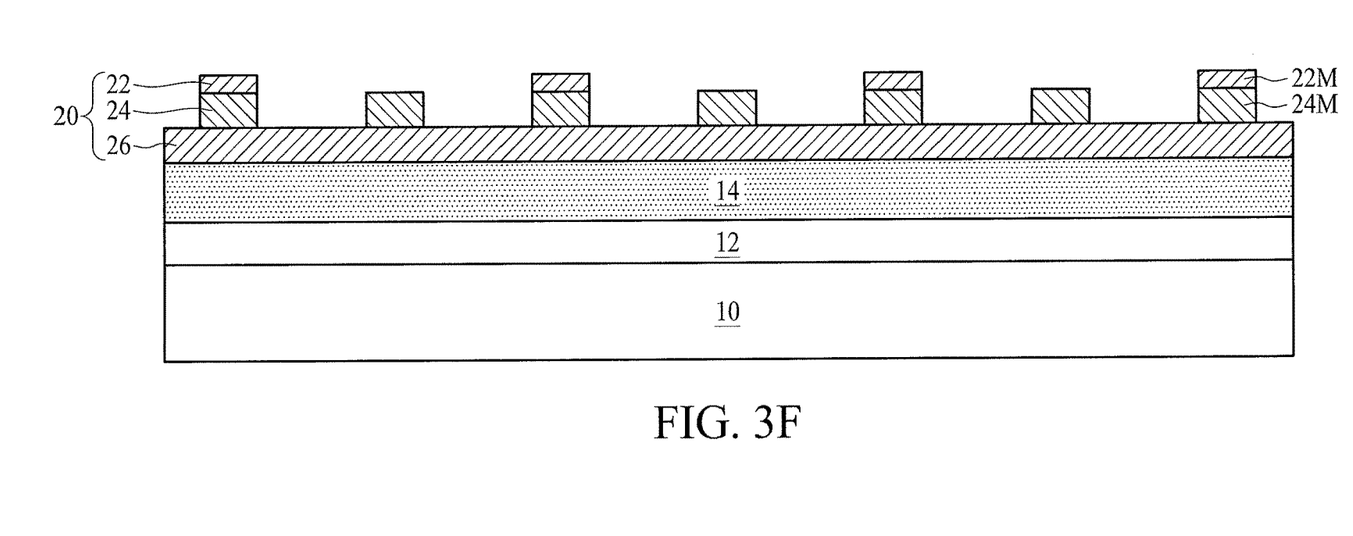

As shown in FIG. 3F, the second photoresist patterns 46 and the second sacrificial layer 40 are removed. In some embodiments, the second photoresist patterns 46 may be removed after the second sacrificial layer 40 is etched, and the second hard mask layer 24 is then etched using the second sacrificial layer 40 as a hard mask. In some alternative embodiments, the second photoresist patterns 46 may be removed after the second sacrificial layer 40 and the second hard mask layer 24 are etched.

Figure 3G:
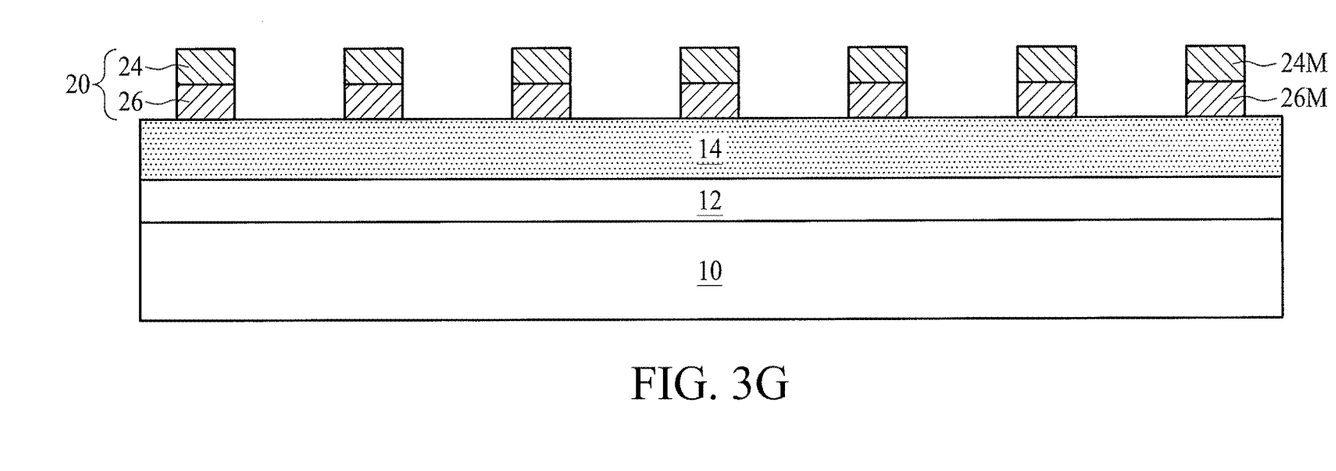

As shown in FIG. 3G, the third hard mask layer 26 exposed through the first hard mask patterns 22M and the second hard mask patterns 24M is removed to form a plurality of third hard mask patterns 26M. In some embodiments, the third hard mask patterns 26M are formed by etching using the the first hard mask patterns 22M and the second hard mask patterns 24M as a hard mask. In some embodiments, the first hard mask patterns 22M over the second hard mask patterns 24M and the third hard mask layer 26 can be removed simultaneously. In some exemplary embodiments, the material of the first hard mask layer 22 is the same as or similar to the material of the third hard mask layer 26, and the thickness of the first hard mask layer 22 is substantially equal to or less than the thickness of the third hard mask layer 26. Therefore, the first hard mask layer 22 and the third hard mask layer 26 can be etched simultaneously during the same etching process. In some embodiments, the third hard mask layer 26 may be etched by an anisotropic etching such as a plasma etching or the like, such that the pattern transfer can be executed more precisely.

Figure 3H:
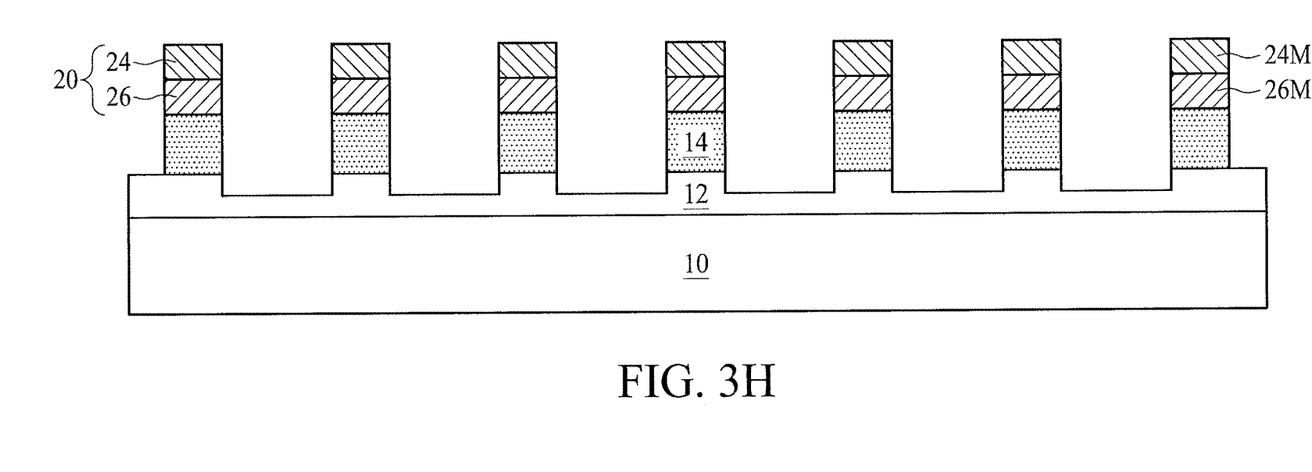

As shown in FIG. 3H, the target layer 12 exposed through the second hard mask patterns 24M and the third hard mask patterns 26M is removed. In some embodiments, the target layer 12 exposed through the second hard mask patterns 24M and the third hard mask patterns 26M is partially removed. In some embodiments, if the lower hard mask layer 14 is formed between the third hard mask patterns 26M and the target layer 12, the lower hard mask layer 14 exposed through the third hard mask patterns 26M may be removed prior to patterning the target layer 12. In some embodiments, the target layer 12 may be etched by an anisotropic etching such as a plasma etching or the like, such that the pattern transfer can be executed more precisely.

Figure 3I:
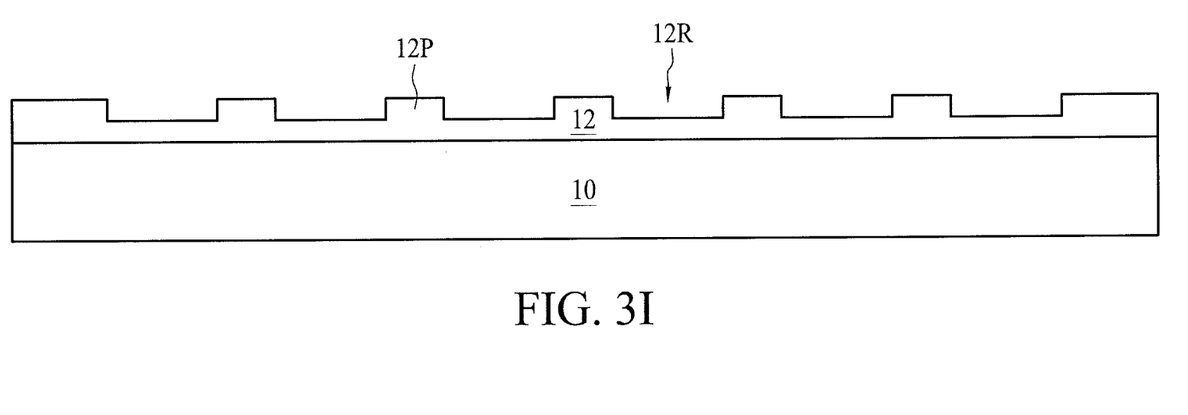

As shown in FIG. 3I, the multi-layered hard mask layer 20 and the lower hard mask layer 14 are removed by, for example, etching, to form the patterned target layer 12. In some embodiments, the patterned target layer 12 includes a plurality of protruding patterns 12P and recessed patterns 12R between adjacent protruding patterns 12P. In some embodiments, the target layer 12 is not etched through, such that the recessed patterns 12R still cover the substrate 10.

The method of preparing a patterned target layer is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4A:
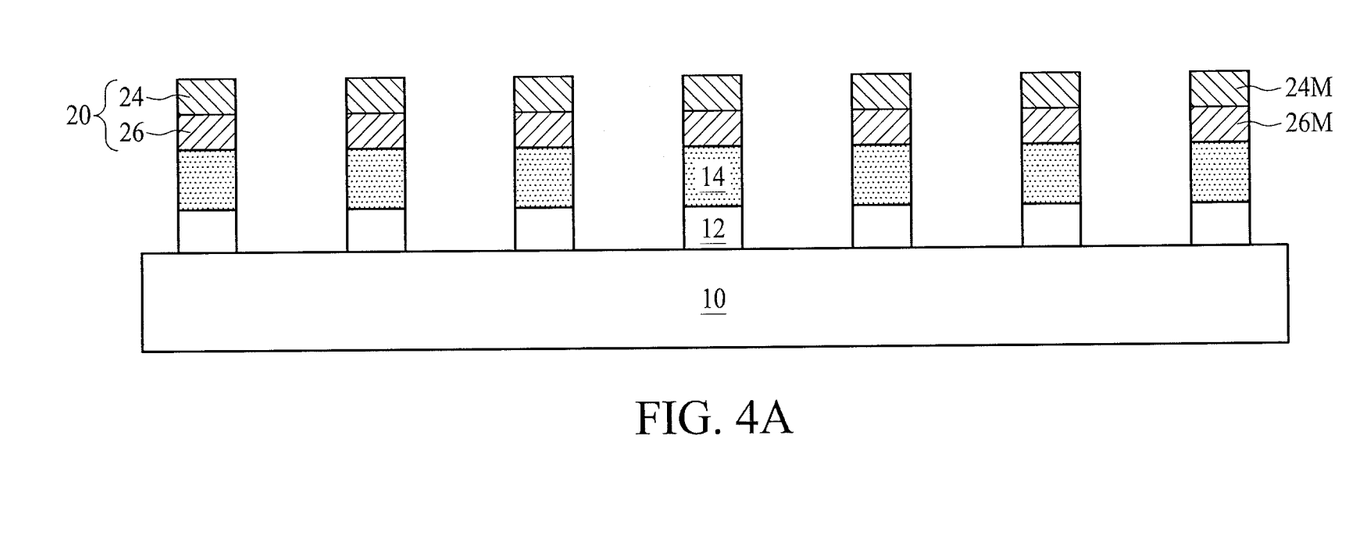
FIG. 4A and FIG. 4B are schematic diagrams at one or more of various steps of preparing a patterned target layer in accordance with some embodiments of the present disclosure.
Figure 4B:
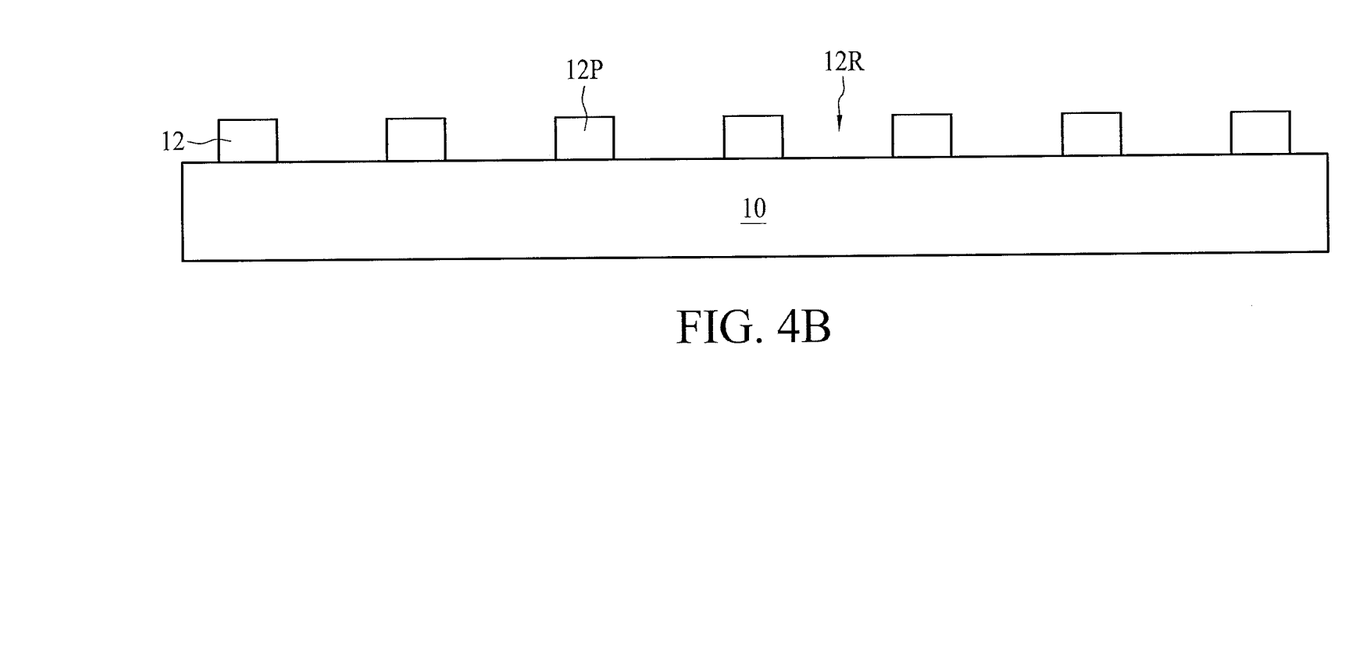

FIG. 4A and FIG. 4B are schematic diagrams at one or more of various steps of preparing a patterned target layer, in accordance with some embodiments of the present disclosure. The method of some embodiments in FIG. 4A and FIG. 4B may be performed subsequent to the processes described in the embodiments of FIG. 3G. As shown in FIG. 4A, the target layer 12 exposed through the second hard mask patterns 24M and the third hard mask patterns 26M may be entirely removed.

As shown in FIG. 4B, the multi-layered hard mask layer 20 and the lower hard mask layer 14 are removed by, for example, etching, to form the patterned target layer 12. In some embodiments, the patterned target layer 12 includes a plurality of protruding patterns 12P and recessed patterns 12R between adjacent protruding patterns 12P. In some embodiments, the recessed patterns 12R may expose the substrate 10.

In some embodiments of the present disclosure, the multi-layered hard mask layer 20 is configured as an upper hard mask layer to prepare fine patterns in the target layer 12. In some embodiments, the first hard mask patterns 22M and the second hard mask patterns 24M are formed by two photolithography processes, and thus the pattern density of the multi-layered hard mask layer 20 can be increased without being limited by photolithography process limitations. In addition, the multi-layered hard mask layer 20 is formed from three or more hard mask layers, and at least some of the hard mask layers have different etching characteristics. Accordingly, the shapes of the hard mask patterns of the multi-layered hard mask layer 20 can be maintained, and thus the hard mask patterns can be precisely transferred to the target layer 12.

In contrast, if a single-layered hard mask layer is adopted to prepare a patterned target layer, the single-layered hard mask layer must undergo several etching processes, and thus the hard mask patterns are damaged. The damaged hard mask pattern results in poor pattern transfer to the target layer.

One aspect of the present disclosure provides a method for preparing a patterned target layer. The method includes the following steps. A target layer is formed over a substrate. A multi-layered hard mask layer is formed over the target layer. The multi-layered hard mask layer includes a first hard mask layer over the target layer, a second hard mask layer between the target layer and the first hard mask layer, and a third hard mask layer between the target layer and the second hard mask layer, wherein a material of the second hard mask layer is different from a material of the first hard mask layer and a material of the third hard mask layer. The first hard mask layer is patterned to form a plurality of first hard mask patterns. The second hard mask layer is patterned to form a plurality of second hard mask patterns, wherein a portion of the second hard mask patterns is covered with the first hard mask patterns, and another portion of the second hard mask patterns is exposed through the first hard mask patterns. The third hard mask layer exposed through the first hard mask patterns and the second hard mask patterns is removed to form a plurality of third hard mask patterns. The target layer exposed through the third hard mask patterns is removed.

One aspect of the present disclosure provides a method for preparing a patterned target layer. The method includes the following steps. A target layer is formed over a substrate. A hard mask layer is formed over the target layer. A plurality of first patterns and second patterns are formed over the hard mask layer, wherein the first patterns are thinner than the second patterns. The hard mask layer exposed through the first patterns and the second patterns is etched to form a plurality of hard mask patterns. The target layer exposed through the hard mask patterns is etched.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a patterned target layer, comprising:

forming a target layer over a substrate;

forming a multi-layered hard mask layer over the target layer, wherein the multi-layered hard mask layer comprises a first hard mask layer over the target layer, a second hard mask layer between the target layer and the first hard mask layer, and a third hard mask layer between the target layer and the second hard mask layer, wherein a material of the second hard mask layer is different from a material of the first hard mask layer and a material of the third hard mask layer, patterning the first hard mask layer to form a plurality of first hard mask patterns;

patterning the second hard mask layer to form a plurality of second hard mask patterns, wherein a portion of the second hard mask patterns is covered with the first hard mask patterns, and another portion of the second hard mask patterns is exposed through the first hard mask patterns;

removing the third hard mask layer exposed through the first hard mask patterns and the second hard mask patterns to form a plurality of third hard mask patterns; and removing the target layer exposed through the third hard mask patterns.

2. The method of claim 1, further comprising removing the multi-layered hard mask layer from the target layer subsequent to the patterning the target layer.

3. The method of claim 1, wherein the patterning the first hard mask layer to form the plurality of first hard mask patterns comprises:

forming a first sacrificial layer over the multi-layered hard mask layer, forming a plurality of first photoresist patterns over the first sacrificial layer;

etching the first sacrificial layer and the first hard mask layer exposed through the first photoresist patterns to form the plurality of first hard mask patterns; and removing the first photoresist patterns and the first sacrificial layer from the multi-layered hard mask layer.

4. The method of claim 1, wherein the patterning the second hard mask layer to form the plurality of second hard mask patterns comprises:

forming a second sacrificial layer over the multi-layered hard mask layer;

forming a plurality of second photoresist patterns over the second sacrificial layer, wherein the second photoresist patterns are arranged offset from the first hard mask patterns;

etching the second sacrificial layer and the second hard mask layer exposed through the second photoresist patterns and exposed through the plurality of first hard mask patterns to form the plurality of second hard mask patterns; and removing the second photoresist patterns and the second sacrificial layer from the multi-layered hard mask layer.

5. The method of claim 1, wherein the material of the first hard mask layer is the same as the material of the third hard mask layer.

6. The method of claim 1, wherein a thickness of the first hard mask layer is substantially equal to or less than a thickness of the third hard mask layer.

7. The method of claim 1, wherein the first hard mask patterns over the second hard mask patterns and the third hard mask layer exposed through the second hard mask patterns are removed simultaneously.

8. The method of claim 1, wherein the removing the target layer exposed through the third hard mask patterns comprises etching the target layer exposed through the third hard mask patterns.

9. The method of claim 1, wherein the removing the target layer exposed through the third hard mask patterns comprises partially removing the target layer exposed through the third hard mask patterns.

10. The method of claim 1, wherein the removing the target layer exposed through the third hard mask patterns comprises entirely removing the target layer exposed through the third hard mask patterns.

11. The method of claim 1, further comprising forming a lower hard mask layer over the target layer prior to the forming the multi-layered hard mask layer.

12. The method of claim 11, further comprising removing the lower hard mask layer exposed through the third hard mask patterns prior to the removing the target layer exposed through the third hard mask patterns.

13. The method of claim 11, wherein a material of the lower hard mask layer is different from the material of the third hard mask layer.

\* \* \* \* \*